(12) United States Patent
Cook

(10) Patent No.: US 10,866,289 B2
(45) Date of Patent: Dec. 15, 2020

(54) MAGNETIC FIELD SENSOR AND ASSOCIATED METHODS INCLUDING DIFFERENTIAL CHOPPING

(71) Applicant: Allegro MicroSystems, LLC, Manchester, NH (US)

(72) Inventor: Aaron Cook, Deerfield, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 170 days.

(21) Appl. No.: 15/936,888

(22) Filed: Mar. 27, 2018

(65) Prior Publication Data
US 2019/0302196 A1 Oct. 3, 2019

(51) Int. Cl.
*G01R 33/07* (2006.01)
*G01D 5/14* (2006.01)
(Continued)

(52) U.S. Cl.
CPC .......... *G01R 33/07* (2013.01); *G01D 5/142* (2013.01); *G01R 33/0017* (2013.01);
(Continued)

(58) Field of Classification Search
CPC .. G01D 5/145; G01R 33/3642; G01R 33/077; G01R 33/075; G01R 33/0029;
(Continued)

(56) References Cited

U.S. PATENT DOCUMENTS 7,425,821 B2 9/2008 Monreal et al.
7,605,647 B1 10/2009 Romero et al.
(Continued)

FOREIGN PATENT DOCUMENTS

JP 2008286695 A 11/2008

OTHER PUBLICATIONS

Extended European Search Report dated Sep. 3, 2019 for European Application No. 19161225.8; 6 Pages.
(Continued)

*Primary Examiner* — Vincent Q Nguyen
*Assistant Examiner* — Trung Nguyen
(74) *Attorney, Agent, or Firm* — Daly, Crowley, Mofford & Durkee, LLP

(57) ABSTRACT

A magnetic field sensor includes a first magnetic field sensing element configured to generate a first magnetic field signal indicative of a magnetic field associated with a target, a second magnetic field sensing element spaced from the first magnetic field sensing element and configured to generate a second magnetic field signal indicative of the magnetic field associated with the target. A switching module coupled to receive the first and second magnetic field signals is configured to generate a combined signal having alternating portions associated with the first and second magnetic field signals. A polarity module coupled to receive the combined signal is configured to invert a polarity of portions of the combined signal associated with one of the first magnetic field signal or the second magnetic field signal to generate an inverted polarity signal and a filter coupled to receive the inverted polarity signal is configured to generate an integrated signal corresponding to a difference of the first and second magnetic field signals.

31 Claims, 7 Drawing Sheets

(51) Int. Cl.
    *H01L 43/04*     (2006.01)
    *H01L 43/06*     (2006.01)
    *G01R 33/00*     (2006.01)

(52) U.S. Cl.
    CPC .......... *G01R 33/0029* (2013.01); *H01L 43/04* (2013.01); *H01L 43/06* (2013.01)

(58) Field of Classification Search
    CPC ..... G01R 33/0005; G01B 7/023; H01L 43/04; H01L 43/06
    USPC ..... 324/76.11, 96, 200, 207.13–207.19, 239, 324/241–247, 500, 529, 530
    See application file for complete search history.

(56) References Cited

U.S. PATENT DOCUMENTS

| | | | |
|---|---|---|---|
| 2011/0018533 A1 | 1/2011 | Cesaretti et al. | |
| 2013/0214774 A1* | 8/2013 | Cesaretti | G01R 33/0041 324/251 |
| 2014/0177674 A1* | 6/2014 | Drouin | G01R 35/005 374/178 |
| 2015/0070002 A1 | 3/2015 | Schott | |

OTHER PUBLICATIONS

Response (with Amended Claims) to European Official Communication dated Oct. 8, 2019 and to European Extended Search Report (EESR) dated Sep. 3, 2019 for European Application No. 19161225.8; Response filed Apr. 2, 2020; 50 Pages.

Communication pursuant to Rule 69 EPC dated Oct. 8, 2019 for European Application No. 19161225.8; 2 pages.

\* cited by examiner

MAGNETIC FIELD SENSOR AND ASSOCIATED METHODS INCLUDING DIFFERENTIAL CHOPPING

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors implementing differential chopping.

BACKGROUND

Magnetic field sensors, which use magnetic field sensing elements, are used in a variety of applications, including, but not limited to, a current sensor that senses a magnetic field generated by a current carried by a current-carrying conductor, a magnetic switch, a proximity detector that senses the proximity of a ferromagnetic or magnetic object, a rotation detector that senses passing ferromagnetic articles, for example, gear teeth, and a magnetic field sensor that senses a strength or density of a magnetic field.

Some magnetic field sensors employ differential magnetic field sensing whereby more than one magnetic field sensing element is used to generate a differential signal that is relatively immune stray magnetic field effects. For example, the output signals from two spatially separated magnetic field sensing elements can be independently amplified and the amplifier output signals can be combined (e.g., subtracted) such that any effects from stray magnetic fields experienced by both sensing elements tend to cancel in the resulting differential magnetic field signal, whereas the field that is desired to be detected can be readily detectable from the resulting differential magnetic field signal.

It is known that Hall Effect elements exhibit an undesirable DC offset voltage. Techniques have been developed to reduce the DC offset voltage, while still allowing the Hall Effect element to sense a magnetic field. One such technique is commonly referred to as "chopping" or "current spinning" and entails driving a Hall Effect element in two or more different directions and receiving output signals at different output terminals as the Hall Effect element is differently driven. In this way, selected drive and signal contact pairs are interchanged during each phase of the chopping and offset voltages of the different driving arrangements tend to cancel.

Chopping is also a well-known technique applied to amplifiers to reduce an offset component and low frequency noise (i.e., flicker noise) of signals applied to the amplifier. Amplifiers implementing chopping are often referred to as chopper stabilized amplifiers.

SUMMARY

According to the disclosure, a magnetic field sensor includes a first magnetic field sensing element configured to generate a first magnetic field signal indicative of a magnetic field associated with a target and a second magnetic field sensing element spaced from the first magnetic field sensing element and configured to generate a second magnetic field signal indicative of the magnetic field associated with the target. A switching module is coupled to receive the first and second magnetic field signals and configured to generate a combined signal having alternating portions associated with the first and second magnetic field signals. A polarity module is coupled to receive the combined signal and configured to invert a polarity of portions of the combined signal associated with one of the first magnetic field signal or the second magnetic field signal to generate an inverted polarity signal. The sensor further includes a filter coupled to receive the inverted polarity signal and configured to generate an integrated signal corresponding to a difference of the first and second magnetic field signals.

With this arrangement, advantageously the benefits of differential magnetic field sensing are achieved with only a single amplifier as compared to a conventional arrangement in which each sensing element has a dedicated amplifier, thereby reducing area and power requirements associated with differential sensing.

Features may include one or more of the following individually or in combination with other features. A clock module can be coupled to the switching module and to the polarity module and configured to provide a clock signal to the switching module and the polarity module. In embodiments, the switching module can be a multiplexer configured to selectively couple the first magnetic field signal or the second magnetic field signal to an output of the switching module based the clock signal. The polarity module is configured to invert the polarity of the one of the alternating portions of the combined signal associated with the first magnetic field signal or with the second magnetic field signal based the clock signal.

In embodiments, the sensor includes an amplifier coupled to receive the combined signal and configured to generate an amplified signal. An analog-to-digital converter can be provided with an input coupled to receive the amplified signal (or the combined signal) and an output at which a digital signal is provided for coupling to the polarity module. In embodiments, the polarity module includes an amplifier coupled to receive the combined signal and configured to amplify the combined signal by a gain having a positive polarity during first ones of the alternating portions of the combined signal and by a gain having a negative polarity during second ones of the alternating portions of the combined signal.

The filter can be a low pass filter having a cutoff frequency less than or equal to a rate of the clock signal. Example filters include a cascaded integrator-comb (CIC) decimation filter or a switch capacitor notch filter.

The magnetic field sensor can include a first offset modulator coupled to the first magnetic field sensing element and configured to generate a first modulated magnetic field signal for coupling to the switching module and a second offset modulator coupled to the second magnetic field sensing element and configured to generate a second modulated magnetic field signal for coupling to the switching module, wherein a rate of modulation by the first offset modulator and the second offset modulator is different than a rate of the clock signal.

A signal processor can be coupled to receive the integrated signal and configured to generate a sensor output signal indicative of one or more of a current associated with the target, a speed of motion of the target, a direction of motion of the target, an angle of the target, or a position of the target. In embodiments, the signal processor is configured to generate a sensor output signal indicative of the magnetic field in more than one dimension. The first and second magnetic field sensing elements can include one or more Hall effect elements or magnetoresistance elements.

Also described is a method for sensing a magnetic field associated with a target, including generating a first magnetic field signal with a first magnetic field sensing element, the first magnetic field signal indicative of a magnetic field associated with the target and generating a second magnetic field signal with a second magnetic field sensing element spaced from the first magnetic field sensing element, the second magnetic field signal indicative of the magnetic field associated with the target. The method can further include generating a combined signal having first portions associated with the first magnetic field signal and second portions alternating with the first portions and associated with the second magnetic field signal. A polarity of the first portions or the second portions of the combined signal can be inverted to generate an inverted polarity signal and the inverted polarity signal can be filtered to generate an integrated signal corresponding to a difference of the first and second magnetic field signals.

According to a further aspect, a magnetic field sensor includes first means for generating a first magnetic field signal in response to the magnetic field associated with a target, second means for generating a second magnetic field signal in response to the magnetic field associated with a target, and switching means coupled to receive the first and second magnetic field signals and generate a combined signal having first portions associated with the first magnetic field signal and second portions alternating with the first portions and associated with the second magnetic field signal. The sensor further includes polarity inverting means responsive to the combined signal to invert a polarity of the first portions or the second portions of the combined signal to generate an inverted polarity signal and filter means coupled to receive the inverted polarity signal and generate an integrated signal corresponding to a difference of the first and second magnetic field signals.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall Effect elements, magnetoresistance elements, or magnetotransistors. As is known, there are different types of Hall Effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch, a proximity detector that senses the proximity of a ferromagnetic or magnetic object, a rotation detector that senses passing ferromagnetic articles, for example, gear teeth, and a magnetic field sensor (e.g., a linear magnetic field sensor) that senses a density of a magnetic field. The circuits and techniques described herein apply to any magnetic field sensor capable of detecting a magnetic field.

As used herein, the term "magnetic field signal" is used to describe any signal that results from a magnetic field experienced by a magnetic field sensing element.

Figure 1:
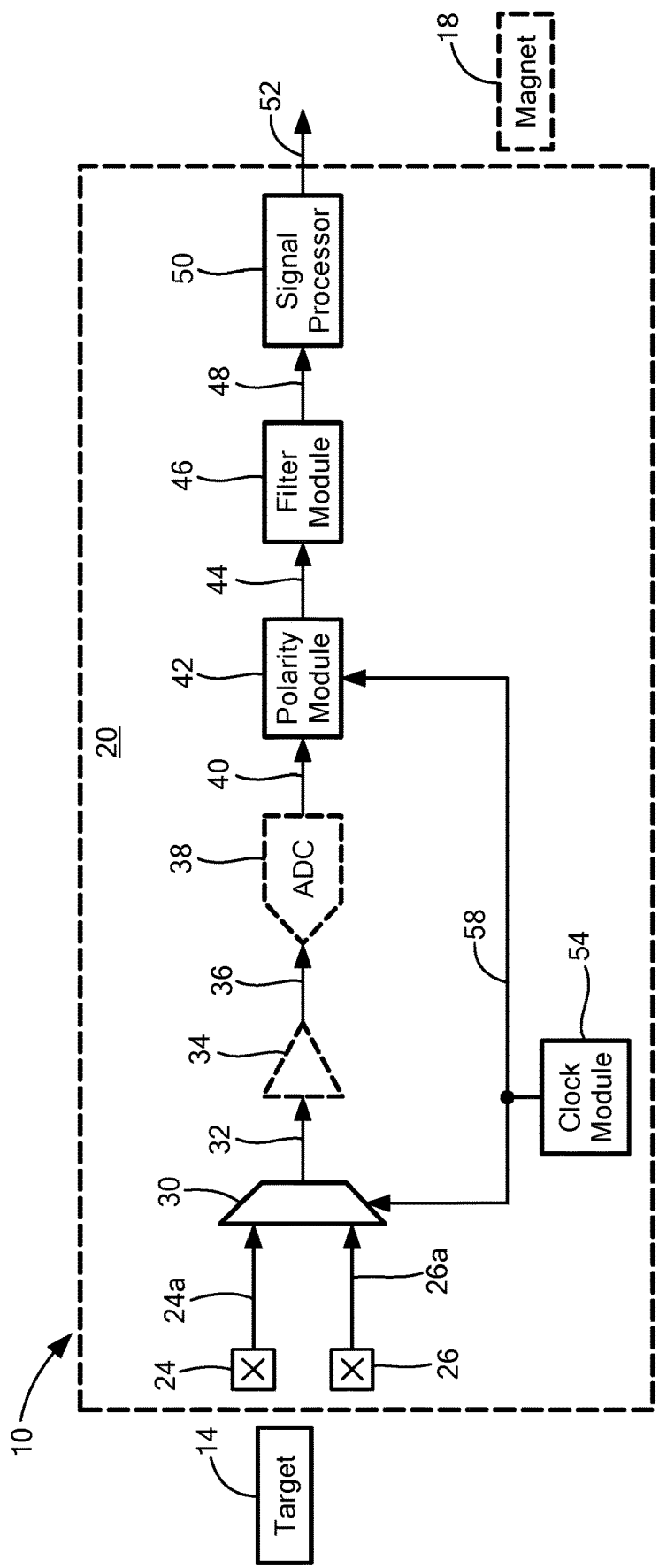
FIG. 1 is a block diagram of a magnetic field sensor including differential chopping.

Referring to FIG. 1, a magnetic field sensor system 10 includes a magnetic field sensor 20 having a plurality of spaced magnetic field sensing elements 24, 26 for sensing a magnetic field affected by a target 14 and generating respective magnetic field signals 24a, 26a. A modulator, as may take the form of a switching module 30, is coupled to receive the first and second magnetic field signals 24a, 26a and is configured to generate a combined signal 32 having alternating portions associated with the first and second magnetic field signals. An example combined signal is shown in FIG. 3B.

A polarity module 42, is coupled to receive the combined signal 32 (or a processed version of the combined signal as will be explained) and is configured to invert a polarity of portions of the combined signal associated with one of the first magnetic field signal or the second magnetic field signal to generate an inverted polarity signal 44. An example inverted polarity signal is shown in FIG. 3C.

A filter 46 is coupled to receive the inverted polarity signal 44 and is configured to generate an integrated signal 48 corresponding to a difference of the first and second magnetic field signals (which integrated signal is referred to herein alternatively as a differential magnetic field signal). With this arrangement, a difference of the first and second magnetic field signals 24a, 26a is provided with fewer components and requiring less power consumption as compared, for example, to a conventional configuration in which two magnetic field signals are independently amplified and then combined to generate a differential magnetic field signal.

Target 14 may be a magnetic element such as a ring magnet or gear with teeth and/or valleys. In some embodiments, the target 14 is a ferromagnetic element and the magnetic field can be generated by a magnet 18 positioned in proximity to the target, such as in a "so-called" back bias configuration.

The example sensor 20 includes two Hall effect elements 24, 26, each spaced from the other by a predetermined distance and configured to generate a respective magnetic field signal 24a, 26a indicative of a magnetic field associated with the target. It will be appreciated that other types of magnetic field sensing elements may be used and still benefit from the advantages described herein and also more than two sensing elements can be used.

In embodiments, each of elements 24, 26 can include a set of individual elements, such as three elements, selected and/or configured to provide three-dimensional magnetic field sensing. For example, each element 24, 26 can include planar and vertical Hall elements arranged to measure magnetic fields in three dimensions. Using this type of configuration in different orientations relative to the target 14 allows each set of elements 24, 26 to sense a different field attributable to the target and the same stray fields. When the difference is taken, any effects from the stray field are removed.

The magnetic field sensor 20 includes a clock module 54 coupled to the switching module 30 and to the polarity module 42 and configured to provide a clock signal 58 to both the switching module 30 and the polarity module 42. The clock signal 58 controls both the rate at which the switching module 30 modulates the magnetic field signals 24a, 26a to generate the combined signal 32 and also the rate at which the polarity module 42 inverts the polarity of the combined signal. In an example embodiment, the clock signal 58 has a frequency on the order of 1 MHz.

In the example embodiment, the switching module 30 is a multiplexer configured to selectively couple the first magnetic field signal 24a or the second magnetic field signal 26a to an output of the switching module to generate the combined signal 32 at a rate controlled by the clock signal 58.

The magnetic field sensor 20 may include an amplifier 34 coupled to receive the combined signal 32 and configured to generate an amplified signal 36.

In some embodiments (e.g., FIGS. 2 and 2A), the amplifier 34 can be eliminated and the polarity module 42 may take the form of an amplifier coupled to receive the combined signal and configured to amplify the combined signal by a gain having a positive polarity during first ones of the alternating portions of the combined signal and by a gain having a negative polarity during second ones of the alternating portions of the combined signal in order to thereby generate the inverted polarity signal. In general, the polarity inversion can be implemented in the analog domain or in the digital domain anywhere along the signal path before the filter 46.

An analog-to-digital converter (ADC) 38 may be provided to convert the amplified signal 36 (or the combined signal 32) into a digital signal 40 for coupling to the polarity module 42. In embodiments containing the ADC 38, the polarity module 42 can operate simply by inverting the sign of the digital representation of the signal. And, in embodiments not containing the ADC 38 in which the polarity module 42 thus operates in the analog domain, polarity inversion can be accomplished by reversing inputs to a differential amplifier with a multiplexer for example.

The filter 46 is a low pass filter having a cutoff frequency less than or equal to a rate of the clock signal 58 and a zero at the frequency of the clock signal 58. With this arrangement, a component of the inverted polarity signal 44 corresponding to an average of the magnetic field signals 24a, 26a appears at one of the zeros and is removed by the filter; and a difference between the magnetic field signals 24a, 26a appears at lower frequencies remains.

Various forms and types of low pass filters are possible including, but not limited to a cascaded integrator-comb (CIC) decimation filter having a decimation rate less than or equal to the rate of the clock signal 58 or a switched capacitor filter, such as the type described in U.S. Pat. No. 7,990,209, issued on Aug. 2, 2011 and entitled "Switched Capacitor Notch Filter" or in U.S. Pat. No. 8,416,014, issued on Apr. 9, 2013 and entitled "Switched Capacitor Notch Filter With Fast Response Time" which patents are incorporated by reference herein in their entirety. It will be appreciated that in embodiments not including the ADC 38, the filter 46 is an analog rather than a digital filter.

A signal processor 50 is coupled to receive the integrated signal 48 and is configured to generate a sensor output signal 52 indicative of one or more of a current associated with the target 14, a speed of motion of the target, a direction of motion of the target, an angle of the target, or a position of the target.

The magnetic field sensor 20 may be provided in the form of an integrated circuit in some embodiments.

Figure 2:
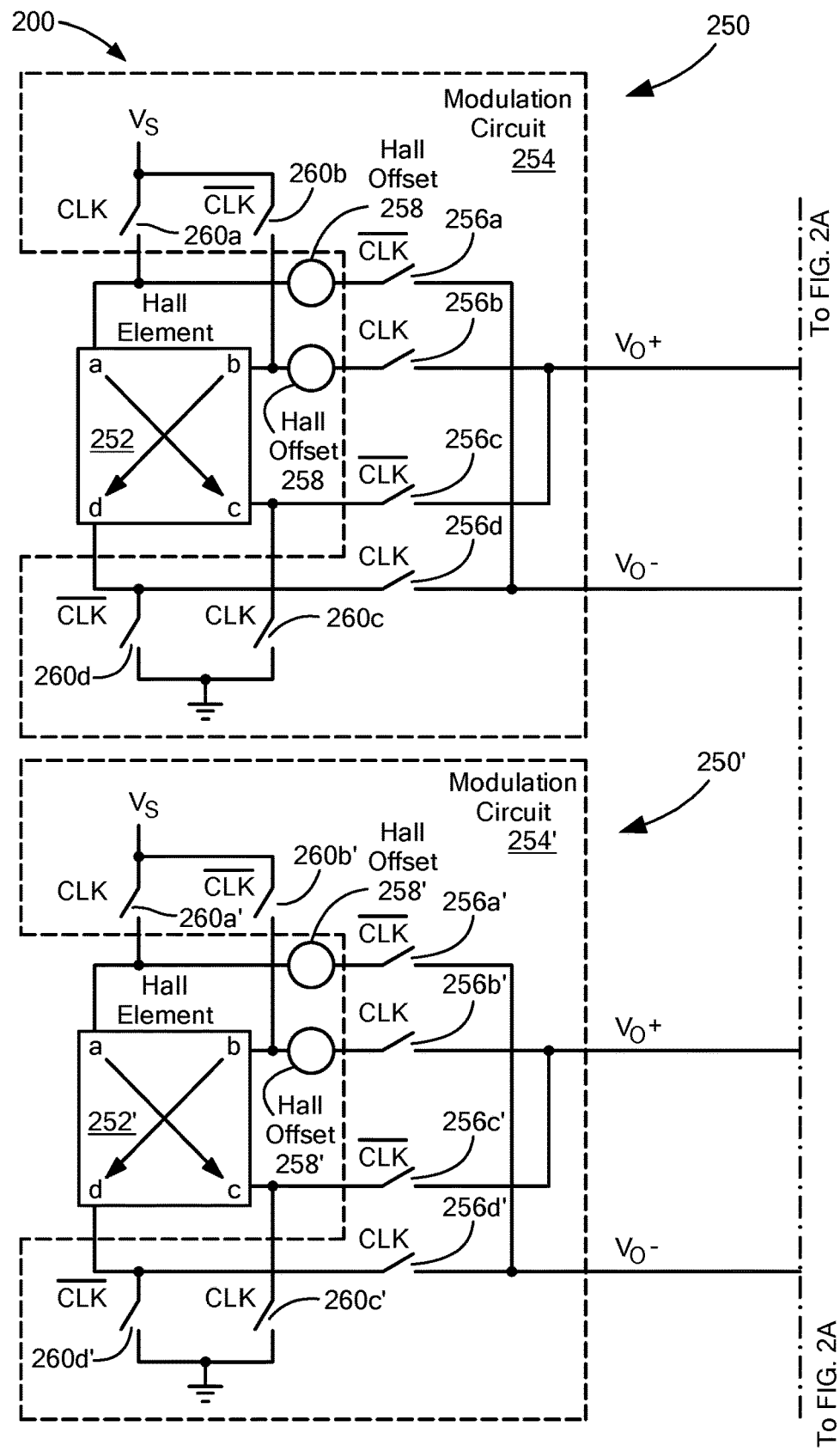
FIGS. 2 and 2A illustrate a block diagram of a magnetic field sensing including both differential chopping and Hall plate chopping.
Figure 2A:
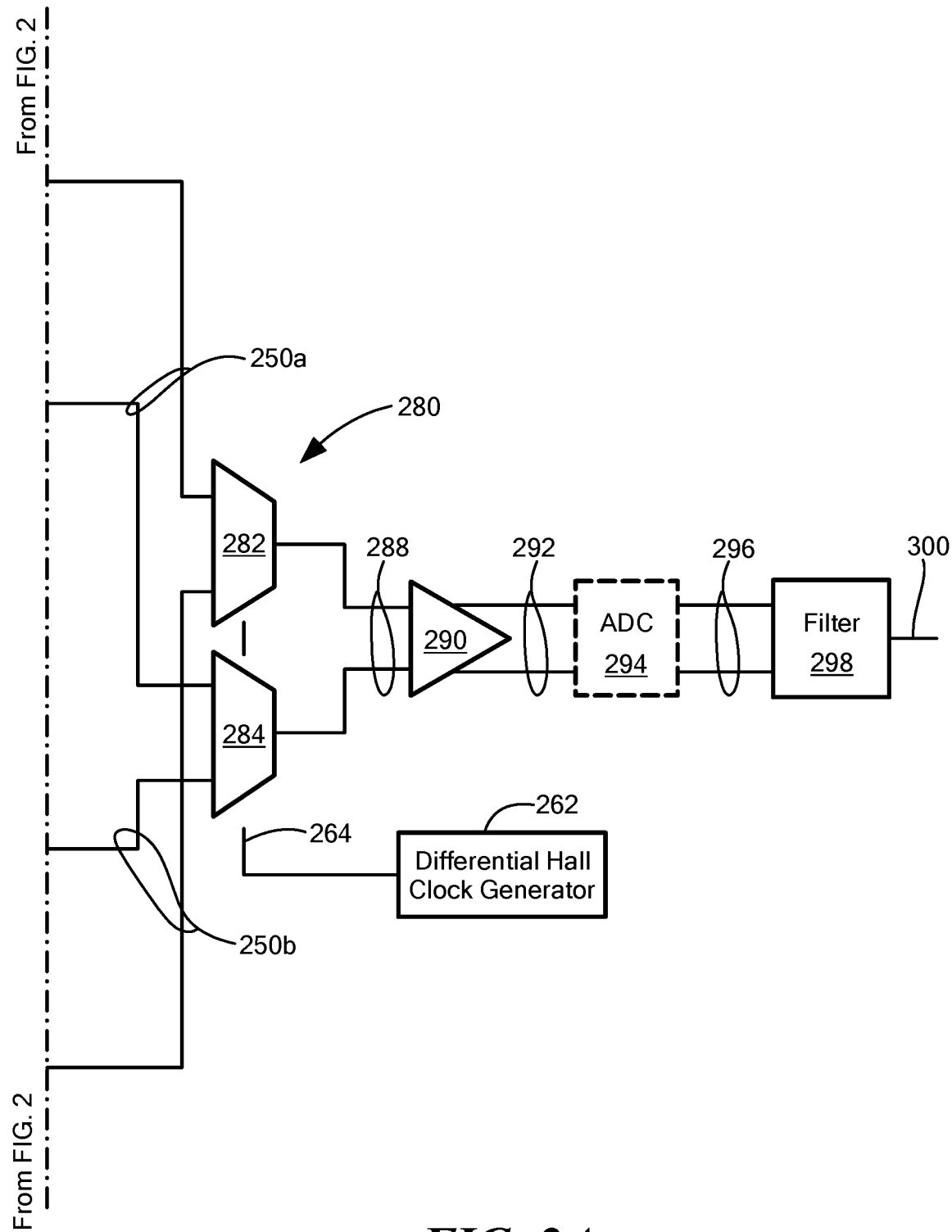

Referring also to FIGS. 2 and 2A, a magnetic field sensor 200 includes magnetic field sensing elements 252, 252', switching module 280 (as may include sub-modules 282, 284), amplifier 290, ADC 294, and filter 298. Here each magnetic field sensing element 252, 252' is chopped to generate respective magnetic field signals 250a, 250b as will be described. Switching modules 282, 284, each receive a respective magnetic field signal 250a, 250b and function to generate a differential combined signal 288 containing alternating portions associated with the first and second magnetic field signals 250a, 250b.

A clock generator 262 generates a clock signal 264 coupled to the switching module 280 to control operation of the switching module to generate the combined signal 288.

Amplifier 290 amplifies the combined signal 288 and in the embodiment of FIGS. 2 and 2A may additionally function to invert a polarity of the combined signal. More particularly, amplifier 290 is coupled to receive the combined signal 288 and configured to amplify the combined signal by a first gain having a positive polarity during first ones of the alternating portions of the combined signal 288 and by a second gain having a negative polarity during second ones of the alternating portions of the combined signal 288 in order to thereby generate an inverted polarity signal 292. Such polarity inversion can be accomplished by selectively coupling and then reversing the coupling of input signal lines of amplifier 290 to the amplifier inputs. Optional ADC 294 can be provided to convert the amplified signal 292 into a digital signal 296 for coupling to filter 298.

Filter 298 (like filter 46 of FIG. 1) is responsive to the inverted polarity signal 292 (or digital version thereof 296) and is configured to generate an integrated signal 300 corresponding to a difference of the first and second magnetic field signals 250*a*, 250*b* (which integrated signal 300 is referred to herein alternatively as a differential magnetic field signal).

Although not shown in FIGS. 2 and 2A, the magnetic field sensor 200 can further include a signal processor that can be the same as or similar to processor 50 of FIG. 1 and thus, that can respond to the integrated signal 300 to generate a sensor output signal as may be indicative of one or more of a current associated with the target, a speed of motion of the target, a direction of motion of the target, an angle of the target, or a position of the target.

Magnetic field sensor 200 differs from sensor 20 (FIG. 1) in that, in addition to including differential chopping generally as described above in connection with FIG. 1, sensor 200 also includes offset chopping circuitry 250, 250'. Offset chopping circuitry 250, 250' operates to reduce offset associated with the Hall plates 252, 252' as described further in U.S. Pat. No. 7,425,821 issued on Sep. 16, 2008 entitled "Chopped Hall Effect Sensor" and incorporated herein by reference in its entirety.

Offset chopping circuitry 250 includes a Hall effect element 252 having typically four contacts and a modulation circuit 254 to periodically connect the supply voltage and inputs of switching module 282 to one pair of contacts or the other. Similarly, offset chopping circuitry 250' includes a Hall effect element 252' having typically four contacts and a modulation circuit 254' to periodically connect the supply voltage and inputs of switching module 284 to one pair of contacts or the other. Use of such switched Hall plates provides a way to discriminate the Hall offset voltage from the magnetically induced signal from the field desired to be detected.

More particularly, the first offset modulator 254 coupled to the first magnetic field sensing element 252 is configured to generate first modulated magnetic field signal 250*a* for coupling to the switching module 282 and the second offset modulator 254' coupled to the second magnetic field sensing element 252' is configured to generate second modulated magnetic field signal 250*b* for coupling to the switching module 284. For simplicity, the offset modulation circuitry 250, 250' is described in connection with example circuitry 250. It will be appreciated however that circuitry 250' operates in the same manner as circuitry 250.

Example Hall plate 252 includes four equally spaced contacts 252*a*, 252*b*, 252*c*, and 252*d*, each coupled to a first terminal of a respective switch 256*a*, 256*b*, 256*c*, and 256*d*, as shown. A second terminal of switches 256*b* and 256*c* are coupled to provide the positive node of the switched Hall output signal 250*a* and the second terminal of switches 256*a* and 256*d* are coupled to provide the negative node of the switched Hall output signal 250*a*.

Switches 260*a*, 260*b*, 260*c*, and 260*d* are arranged to selectively couple the Hall contacts 252*a*, 252*b*, 252*c*, 252*d* to the supply voltage Vs and ground. More particularly, switches 256*b*, 256*d*, 260*a*, and 260*c* are controlled by a two state clock signal CLK and switches 256*a*, 256*c*, 260*b*, and 260*d* are controlled by a complementary clock signal CLK/, as shown. The Hall offset voltage can be represented as a voltage source 258 between the Hall element 252 and the modulation circuit 254.

In operation, during a first phase of the CLK signal, current flows from terminal 252*a* to 252*c* and the switched Hall output signal 250*a* is equal to $V_H + V_{op}$, where $V_{op}$ is the Hall plate offset voltage or Hall offset signal component 258 and $V_H$ is the magnetic signal component. During the alternate phase of the CLK signal, current flows from terminal 252*b* to 252*d* and the switched Hall output signal 250*a* is equal to $V_H - V_{op}$. Thus, the modulation circuit 254 modulates the Hall offset signal component $V_{op}$ 258 and the magnetic signal component $V_H$ remains substantially invariant. The Hall offset signal component thus modulated can be demodulated by the amplifier 290 and removed by low pass filter 298.

The rate of modulation by the first offset modulator 250 and the second offset modulator 250' is greater than a rate of the clock signal 264. In an example embodiment, the offset chopping frequency (i.e., the rate of the clock signal CLK) is on the order of 2 MHz and the frequency of the clock signal 264 is on the order 1 MHz. More generally, the rate of modulation by the first and second offset modulators 250, 250' is different than (and in some embodiments may be a multiple of) the rate of switching by switching module 280.

Figure 3:
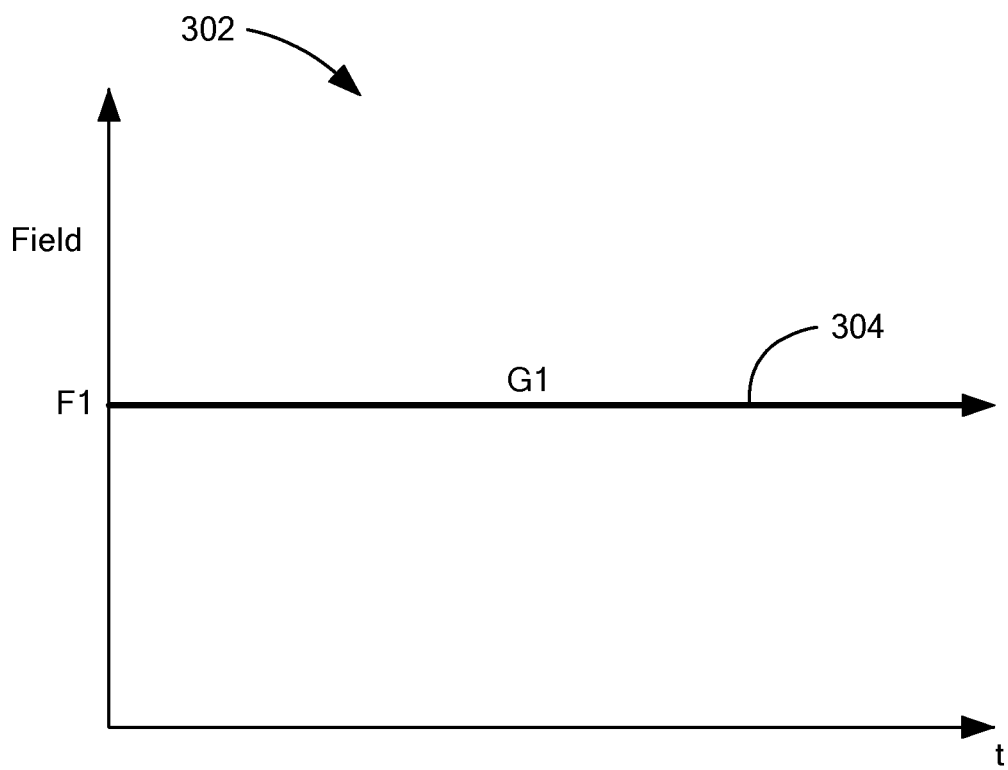
FIG. 3 is a waveform showing an example magnetic field signal from a first sensing element.
Figure 3A:
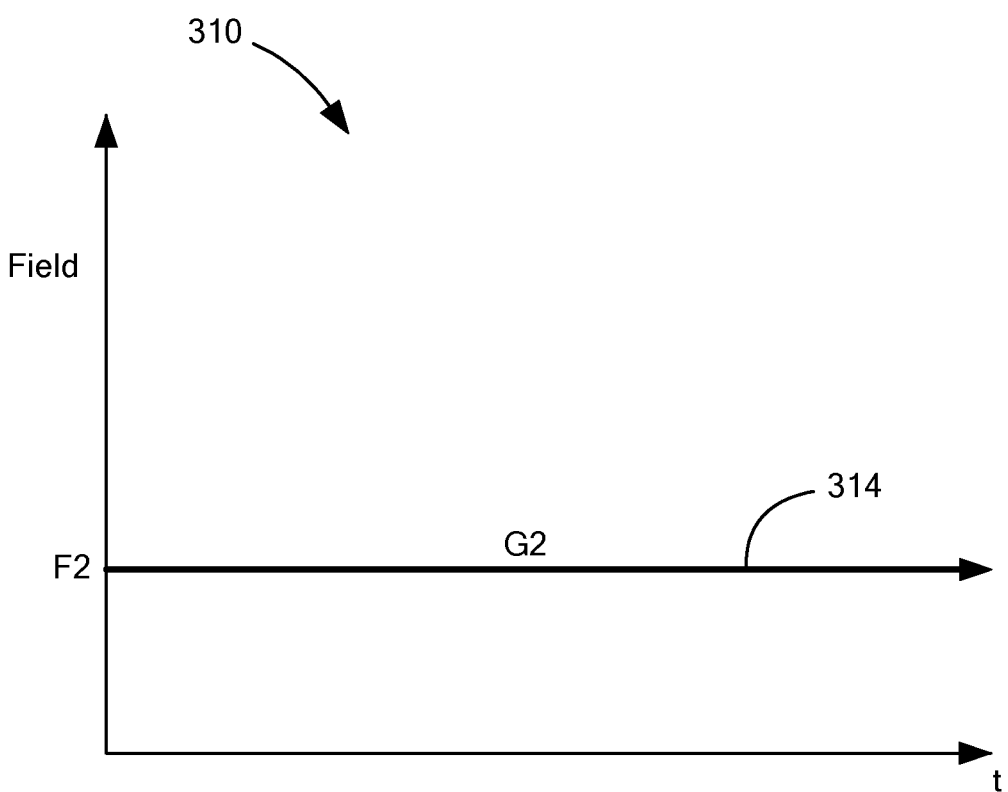
FIG. 3A is a waveform showing an example magnetic field signal from a second sensing element spaced from the first sensing element.
Figure 3B:
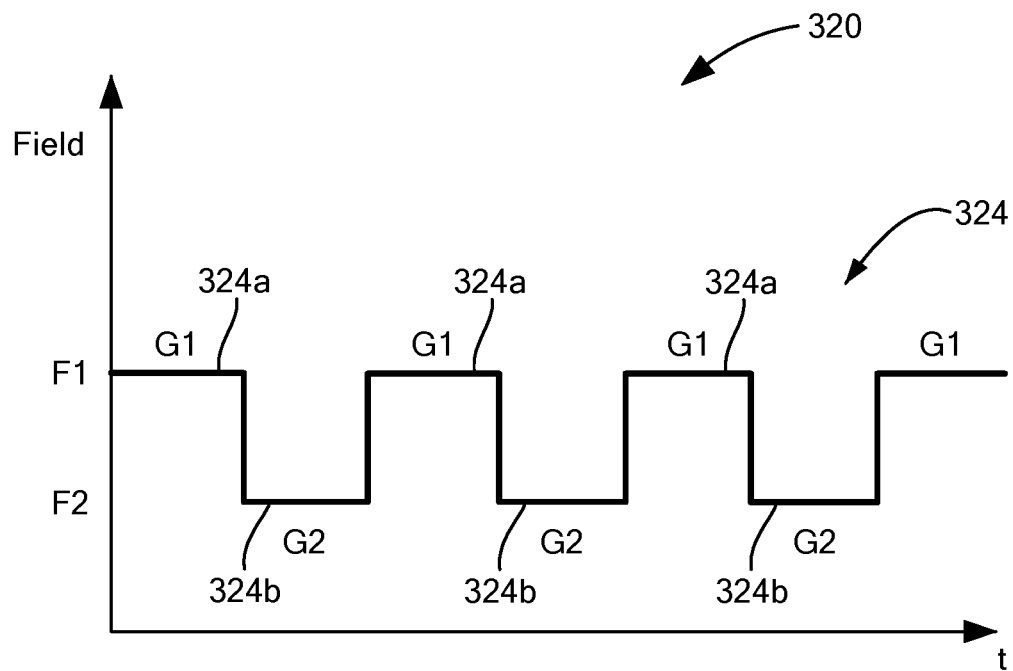
FIG. 3B is a waveform showing an example combined signal having alternating portions associated with the first and second magnetic field signals of FIGS. 3 and 3A.
Figure 3C:
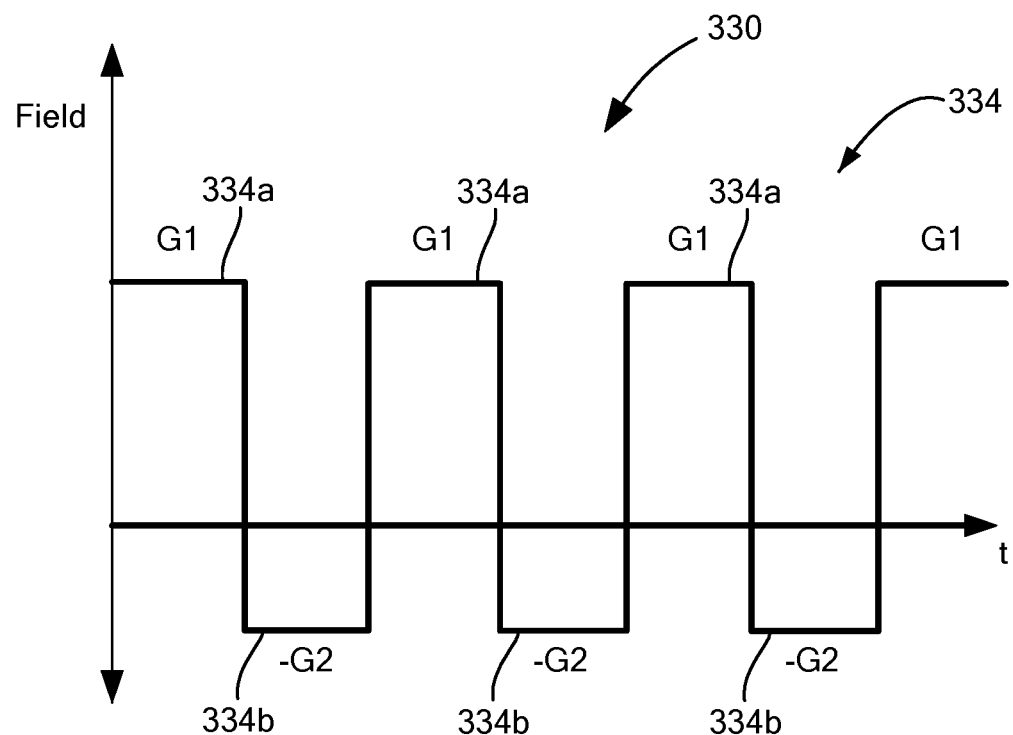
FIG. 3C is a waveform showing an example inverted polarity signal generated by inverting portions of the combined signal of FIG. 3B associated with the first magnetic field signal or the second magnetic field signal.
Figure 3D:
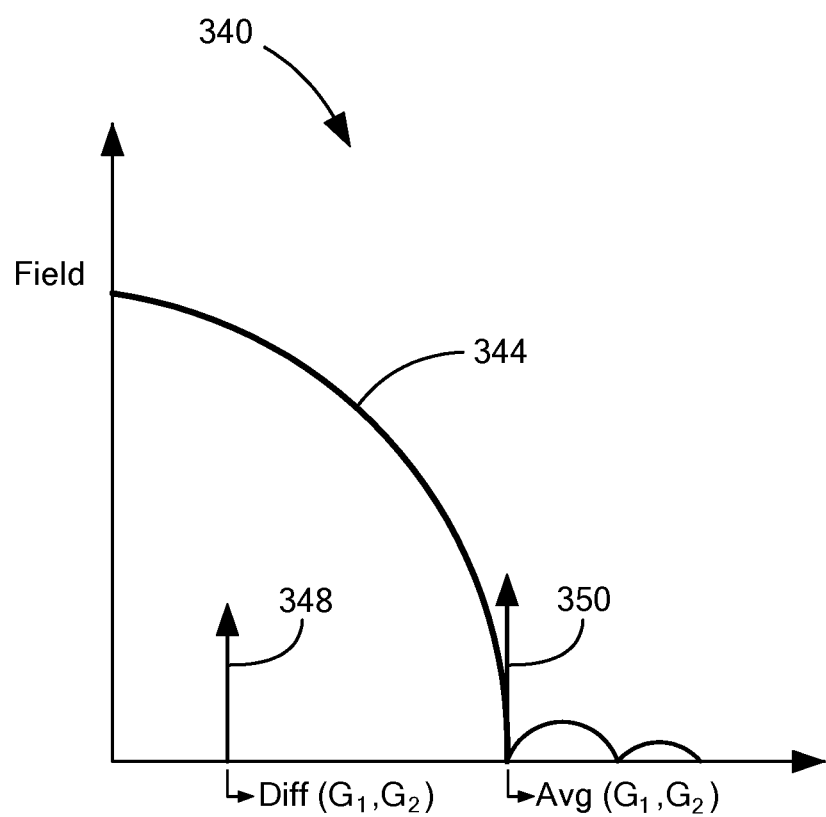
FIG. 3D illustrates a frequency response of a filter used to filter the inverted polarity signal of FIG. 3C to filter a difference signal component and to pass an integrated signal component corresponding to a difference of the first and second magnetic field signals.

Referring to FIGS. 3-3D, waveforms associated with the differential chopping operation of FIG. 1 are shown in which the x-axis represents arbitrary units of time and the y-axis represents field strength in Gauss. FIGS. 3 and 3A show respective example magnetic field signal waveforms 302, 310. Magnetic field signal 304 of FIG. 3 can correspond to magnetic field signal 24*a* as sensed by sensing element 24 for example and magnetic field signal 314 of FIG. 3A can correspond to magnetic field signal 26*a* as sensed by sensing element 26, for example. Because sensing elements 24, 26 are at different respective positions relative to the target 14, the sensed field strengths G1, G2 are different.

Referring to FIG. 3B, a waveform 320 shows an example combined signal 324 that can be the same as or similar to combined signal 32 provided at the output of multiplexer 30 of FIG. 1. Thus, first portions 324*a* of combined signal 324 correspond to the first magnetic field signal 304 of FIG. 3 (and thus have a field strength of G1) and alternating second portions 324*b* of combined signal 324 correspond to the second magnetic field signal 314 of FIG. 3B (and thus have a field strength of G2).

Referring to FIG. 3C, a waveform 330 shows an example inverted polarity signal 334 that can be the same as or similar to inverted polarity signal 44 provided at the output of polarity module 42 of FIG. 1. Thus, in inverted polarity signal 334, portions of the combined signal 324 associated with one of the first magnetic field signal or the second magnetic field signal are inverted. Stated differently, either portions 324*a* or portions 324*b* of combined signal 324 are inverted to generate inverted polarity signal 334. Here, portions 324*b* of combined signal 324 (which portions are associated with the second magnetic field signal 314) are inverted. The resulting inverted polarity signal 334 thus has first portions 334*a* associated with the first magnetic field signal 304 and having a field strength G1 and second, alternating portions 334*b* associated with the second magnetic field signal 314 but with an inverted polarity and thus, having a field strength −G2, as shown.

Referring to FIG. 3D, a waveform 340 shows an example filter response 344 as may be associated with the filter module 46 of FIG. 1, in which the x-axis represents arbitrary units of frequency and the y-axis represents gain in decibels.

Also shown are frequency domain components 348, 350 of the inverted polarity signal 334.

A first component 348 of the inverted polarity signal 334 corresponds to a difference between the first and second magnetic field signals (e.g., signals 24a and 26a) and appears at a relatively low frequency to be removed by the filter. A second component 350 of the inverted polarity signal 334 corresponds to an average of the first and second magnetic field signals and appears at a zero of the filter. Thus, the output of the filter 48 corresponds to the difference component 348 of the first and second magnetic field signals and the effects of stray fields are eliminated by filtering the averaged component 350.

Figure 4:
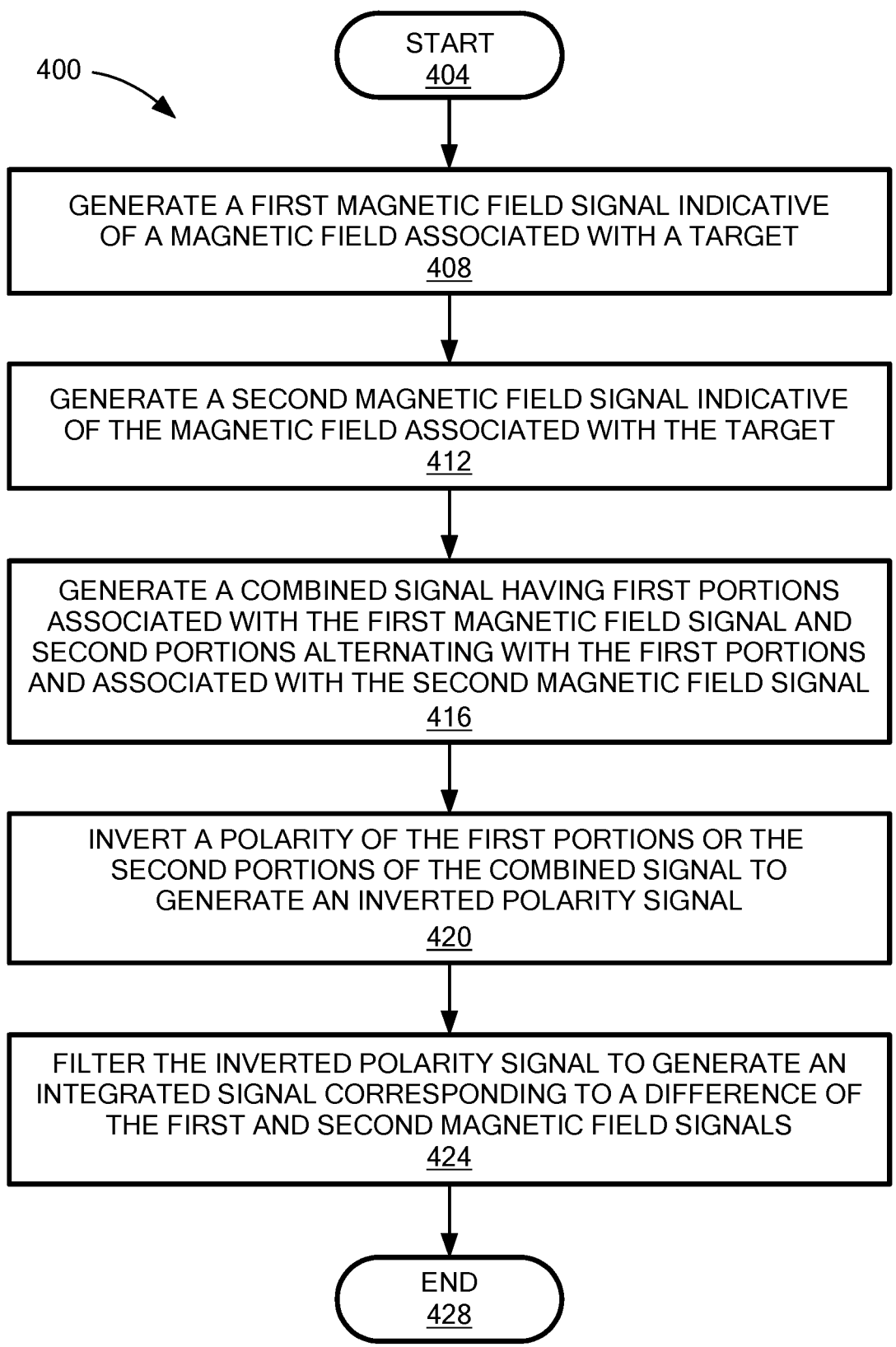
FIG. 4 is a flow diagram illustrating a process for generating the integrated signal of FIG. 3D.

Referring to FIG. 4, a method 400 for sensing a magnetic field associated with a target begins at block 404 following which a first magnetic field signal indicative of a magnetic field associated with the target is generated with a first magnetic field sensing element or elements at block 408. At block 412, a second magnetic field signal indicative of the magnetic field associated with the target is generated by a second magnetic field sensing element or elements spaced from the first element(s). For example, the first magnetic field signal can be generated by first sensing element 24 and second magnetic field signal can be generated by second sensing element 26 of FIG. 1.

At block 416, a combined signal having first portions associated with the first magnetic field signal and second portions alternating with the first portions and associated with the second magnetic field signal is generated. In the embodiment of FIG. 1 for example, the combined signal 32 is generated by multiplexer 30.

A polarity of the first portions or the second portions of the combined signal is inverted at block 420 to generate an inverted polarity signal. For example, polarity module 42 of FIG. 1 can generate inverted polarity signal 44.

At block 424, the inverted polarity signal is filtered (e.g., by filter 46 of FIG. 1) to generate a filtered signal (e.g., signal 48 of FIG. 1). As described, the filtered signal is representative of a difference of the first and second magnetic field signals and is substantially immune to the effects of stray fields common to the sensing elements.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A magnetic field sensor comprising:
    a first magnetic field sensing element configured to generate a first magnetic field signal indicative of a magnetic field associated with a target;
    a second magnetic field sensing element spaced from the first magnetic field sensing element and configured to generate a second magnetic field signal indicative of the magnetic field associated with the target;
    a switching module directly connected to the first and second magnetic field sensing elements, the switching module configured to receive the first and second magnetic field signals directly from the first and second magnetic field sensing elements and configured to generate a combined signal having alternating portions associated with the first and second magnetic field signals;
    a polarity module coupled to receive the combined signal and configured to invert a polarity of portions of the combined signal associated with one of the first magnetic field signal or the second magnetic field signal to generate an inverted polarity signal; and
    a filter coupled to receive the inverted polarity signal and configured to generate an averaged signal corresponding to an average of the first and second magnetic field signals.

2. The magnetic field sensor of claim 1, further comprising a clock module coupled to the switching module and to the polarity module and configured to provide a clock signal to the switching module and the polarity module.

3. The magnetic field sensor of claim 2, wherein the switching module comprises a multiplexer configured to selectively couple the first magnetic field signal or the second magnetic field signal to an output of the switching module based the clock signal.

4. The magnetic field sensor of claim 2, wherein the polarity module is configured to invert the polarity of the one of the alternating portions of the combined signal associated with the first magnetic field signal or with the second magnetic field signal based the clock signal.

5. The magnetic field sensor of claim 1, further comprising an amplifier coupled to receive the combined signal and configured to generate an amplified signal.

6. The magnetic field sensor of claim 5, further comprising an analog-to-digital converter having an input coupled to receive the amplified signal and an output at which a digital signal is provided for coupling to the polarity module.

7. The magnetic field sensor of claim 1, wherein the polarity module comprises an amplifier coupled to receive the combined signal and configured to amplify the combined signal by a gain having a positive polarity during first ones of the alternating portions of the combined signal and by a gain having a negative polarity during second ones of the alternating portions of the combined signal.

8. The magnetic field sensor of claim 2, wherein the filter comprises a low pass filter having a cutoff frequency less than or equal to a rate of the clock signal.

9. The magnetic field sensor of claim 8, wherein the low pass filter comprises at least one of a cascaded integrator-comb (CIC) decimation filter or a switch capacitor notch filter.

10. A magnetic field sensor comprising:
    a first magnetic field sensing element configured to generate a first magnetic field signal indicative of a magnetic field associated with a target;
    a second magnetic field sensing element spaced from the first magnetic field sensing element and configured to generate a second magnetic field signal indicative of the magnetic field associated with the target;
    a switching module coupled to receive the first and second magnetic field signals and configured to generate a combined signal having alternating portions associated with the first and second magnetic field signals;
    a polarity module coupled to receive the combined signal and configured to invert a polarity of portions of the combined signal associated with one of the first magnetic field signal or the second magnetic field signal to generate an inverted polarity signal;

a filter coupled to receive the inverted polarity signal and configured to generate an averaged signal corresponding to an average of the first and second magnetic field signals;

a clock module coupled to the switching module and to the polarity module and configured to provide a clock signal to the switching module and the polarity module;

a first offset modulator coupled to the first magnetic field sensing element and configured to generate a first modulated magnetic field signal for coupling to the switching module; and a second offset modulator coupled to the second magnetic field sensing element and configured to generate a second modulated magnetic field signal for coupling to the switching module, wherein a rate of modulation by the first offset modulator and the second offset modulator is different than a rate of the clock signal.

11. The magnetic field sensor of claim 1, further comprising a signal processor coupled to receive the averaged signal and configured to generate a sensor output signal indicative of one or more of a current associated with the target, a speed of motion of the target, a direction of motion of the target, an angle of the target, or a position of the target.

12. The magnetic field sensor of claim 11, wherein the signal processor is further configured to generate a sensor output signal indicative of the magnetic field in more than one dimension.

13. The magnetic field sensor of claim 1, wherein the first and second magnetic field sensing elements comprise one or more Hall effect elements or magnetoresistance elements.

14. A method for sensing a magnetic field associated with a target, the method comprising:

generating a first magnetic field signal with a first magnetic field sensing element, the first magnetic field signal indicative of a magnetic field associated with the target;

generating a second magnetic field signal with a second magnetic field sensing element spaced from the first magnetic field sensing element, the second magnetic field signal indicative of the magnetic field associated with the target;

receiving the first magnetic field signal directly from the first magnetic sensing element at a switching module, the switching module being directly connected to the first and second magnetic field sensing elements;

receiving the second magnetic field signal directly from the second magnetic sensing element at the switching module;

generating, at the switching module, a combined signal having first portions associated with the first magnetic field signal and second portions alternating with the first portions and associated with the second magnetic field signal;

inverting a polarity of the first portions or the second portions of the combined signal to generate an inverted polarity signal; and filtering the inverted polarity signal to generate an averaged signal corresponding to an average of the first and second magnetic field signals.

15. The method of claim 14, further comprising providing a clock signal for use in generating the combined signal and inverting the polarity of the first portions or the second portions of the combined signal to generate the inverted polarity signal.

16. The method of claim 15, wherein inverting the polarity of the first portions or the second portions of the combined signal comprises inverting the polarity of the first portions or the second portions of the combined signal based on the clock signal.

17. The method of claim 14, further comprising amplifying the combined signal.

18. The method of claim 17, wherein inverting the polarity of the first portions or the second portions of the combined signal comprises amplifying the combined signal by a gain having a positive polarity during first ones of the alternating portions of the combined signal and amplifying the combined signal by a gain having a negative polarity during second ones of the alternating portions of the combined signal.

19. The method of claim 17, further comprising converting the combined signal to a digital signal before inverting a polarity of the first portions or the second portions of the combined signal to generate the inverted polarity signal.

20. The method of claim 15, wherein filtering the inverted polarity signal to generate the averaged signal comprises using a low pass filter having a cutoff frequency less than or equal to a rate of the clock signal.

21. The method of claim 13, further comprising providing a sensor output signal based on the averaged signal, the sensor output signal indicative of one or more of a current associated with the target, a speed of motion of the target, a direction of motion of the target, an angle of the target, or a position of the target.

22. A magnetic field sensor comprising:

first means for generating a first magnetic field signal in response to the magnetic field associated with a target;

second means for generating a second magnetic field signal in response to the magnetic field associated with a target;

switching means directly connected to the first means for generating the first magnetic field signal and directly connected to the second means for generating the second magnetic field signal, the switching means configured to receive the first and second magnetic field signals directly from the first means for generating a first magnetic field signal and the second means for generating a second magnetic field signal, and configured to generate a combined signal having first portions associated with the first magnetic field signal and second portions alternating with the first portions and associated with the second magnetic field signal;

polarity inverting means responsive to the combined signal to invert a polarity of the first portions or the second portions of the combined signal to generate an inverted polarity signal; and filter means coupled to receive the inverted polarity signal and generate an averaged signal corresponding to an average of the first and second magnetic field signals.

23. The magnetic field sensor of claim 22, further comprising a clock signal generating means to provide a clock signal to the switching means and the polarity inverting means.

24. The magnetic field sensor of claim 22, further comprising sensor output signal generating means responsive to the averaged signal for generating a sensor output signal indicative of one or more of a current associated with the target, a speed of motion of the target, a direction of motion of the target, an angle of the target, or a position of the target.

25. The magnetic field sensor of claim 10, wherein the switching module comprises a multiplexer configured to selectively couple the first magnetic field signal or the second magnetic field signal to an output of the switching module based the clock signal.

26. The magnetic field sensor of claim 10, wherein the polarity module is configured to invert the polarity of the one of the alternating portions of the combined signal associated with the first magnetic field signal or with the second magnetic field signal based the clock signal.

27. The magnetic field sensor of claim 10, further comprising an amplifier coupled to receive the combined signal and configured to generate an amplified signal.

28. The magnetic field sensor of claim 27, further comprising an analog-to-digital converter having an input coupled to receive the amplified signal and an output at which a digital signal is provided for coupling to the polarity module.

29. The magnetic field sensor of claim 10, wherein the polarity module comprises an amplifier coupled to receive the combined signal and configured to amplify the combined signal by a gain having a positive polarity during first ones of the alternating portions of the combined signal and by a gain having a negative polarity during second ones of the alternating portions of the combined signal.

30. The magnetic field sensor of claim 10, wherein the filter comprises a low pass filter having a cutoff frequency less than or equal to a rate of the clock signal.

31. The magnetic field sensor of claim 30, wherein the low pass filter comprises at least one of a cascaded integrator-comb (CIC) decimation filter or a switch capacitor notch filter.

* * * * *

UNITED STATES PATENT AND TRADEMARK OFFICE
CERTIFICATE OF CORRECTION

PATENT NO. : 10,866,289 B2
APPLICATION NO. : 15/936888
DATED : December 15, 2020
INVENTOR(S) : Aaron Cook It is certified that error appears in the above-identified patent and that said Letters Patent is hereby corrected as shown below:

In the Specification

Column 1, Line 35, delete "immune stray" and replace with --immune to stray--.

Column 1, Line 44, delete "Effect" and replace with --effect--.

Column 1, Line 47, delete "Effect" and replace with --effect--.

Column 1, Line 49, delete "Effect" and replace with --effect--.

Column 1, Line 51, delete "Effect" and replace with --effect--.

Column 2, Line 16, delete "advantageously" and replace with --advantageously,--.

Column 3, Line 51, delete "systems" and replace with --systems,--.

Column 3, Line 56, delete "sensing including" and replace with --sensing element including--.

Column 4, Line 18, delete "Effect" and replace with --effect--.

Column 4, Line 20, delete "Effect" and replace with --effect--.

Column 4, Line 66, delete "42, is" and replace with --42 is--.

Column 5, Line 22, delete ""so-called" back bias" and replace with --so-called "back bias"--.

Column 6, Line 16, delete "multiplexer" and replace with --multiplexer,--.

Column 6, Line 24, delete "appears" and replace with --appearing--.

Signed and Sealed this
Nineteenth Day of April, 2022

*Katherine Kelly Vidal*
Katherine Kelly Vidal
*Director of the United States Patent and Trademark Office*

Column 6, Line 25, delete "possible" and replace with --possible,--.

Column 6, Line 26, delete "to" and replace with --to,--.

Column 6, Line 51, delete "284," and replace with --284--.

Column 8, Line 22, delete "order 1" and replace with --order of 1--.

Column 8, Lines 32-33, delete "24 for example" and replace with --24, for example,--.

Column 9, Line 23, delete "first" and replace with --the first--.

Column 9, Lines 23-24, delete "and second" and replace with --and the second--.

In the Claims

Column 10, Line 24, delete "based the" and replace with --based on the--.

Column 10, Line 29, delete "based the" and replace with --based on the--.